United States Patent [19]

Greubel et al.

[11] 4,257,676

[45] Mar. 24, 1981

[54] DEVICE FOR COLLECTING LIGHT

[75] Inventors: Waldemar Greubel; Ferdinand Quella, both of Munich, Fed. Rep. of Germany

[73] Assignee: Siemens Aktiengesellschaft, Berlin & Munich, Fed. Rep. of Germany

[21] Appl. No.: 62,734

[22] Filed: Aug. 1, 1979

[30] Foreign Application Priority Data

Aug. 2, 1978 [DE] Fed. Rep. of Germany ....... 2833926

[51] Int. Cl.³ .......................... G02B 5/14; H01L 31/00
[52] U.S. Cl. ................................... 350/96.34; 136/247
[58] Field of Search .......................... 350/96.30, 96.34; 136/89 FC

[56] References Cited

U.S. PATENT DOCUMENTS 4,110,123  8/1978  Goetzberger .

FOREIGN PATENT DOCUMENTS 2554226  8/1977  Fed. Rep. of Germany .
2620115  10/1977 Fed. Rep. of Germany .
2724748  12/1978 Fed. Rep. of Germany .
2742899  of 0000 Fed. Rep. of Germany .

OTHER PUBLICATIONS

Winsor, "Chemical Reviews, Binary & Multicomponent Solutions of Amphiphillic Compounds," Jan. 1968.
Mauer et al., Research Disclosure No. 129, 1975, paragraph 12930.
Goetzberger et al., Applied Physics, vol. 14, pp. 123–129, 1977, "Solar Energy Conversion with Fluorescent Collectors."
Greubel et al., Elektronic, vol. 6, pp. 55–56, 1977, "Das Fluoreszenz-Aktivierte Display."
Von Lippert, Gesellschaft Fur Physikalische Chemie, pp. 962–975, vol. 61, 6/57.
Keil, "Design Principles of Fluorescence Radiation Converters," Nuclear Instruments & Methods, vol. 87, pp. 111–123 (1970).

*Primary Examiner*—John K. Corbin
*Assistant Examiner*—Rodney B. Bovernick
*Attorney, Agent, or Firm*—Hill, Van Santen, Steadman, Chiara & Simpson

[57] ABSTRACT

A light-collecting device in the form of, for example, a rectangularly-shaped body having a so-called "fluorescent plate" with at least one light-exit window is comprised of a solid carrier material having an index of refraction greater than one, such as a polar, water-containing amorphous material based on a polysilicate or a polyphosphate and containing organic or inorganic fluorescent particles therein, which have finite dipole moments with different values in the basic and the excited state, with the fluorescent particles being substantially uniformly distributed throughout the carrier material. In embodiments where the fluorescent particles are organic, an amphiphilic additive, such as a soap, is colloidally dissolved in the carrier material in such a manner that the fluorescent particles are each surrounded by a colloid particle. The disclosed device is useful as a solar collector, an optical indicia transmitter or an image brightener for passive displays.

9 Claims, 1 Drawing Figure

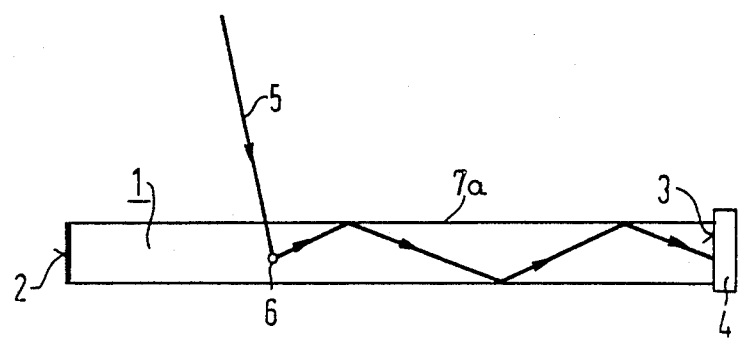

DEVICE FOR COLLECTING LIGHT

BACKGROUND OF THE INVENTION

1. Field of the Invention

The invention relates to a device for concentrating radiant energy and somewhat more particularly to a device for collecting light via a "fluorescent" plate.

2. Prior Art

Devices for collecting light having, for example, a plate-shaped body (sometimes referred to as a "fluorescent" plate or body) functioning as a light trap having at least one light-exit window and comprised of a solid polymerized synthetic material having fluorescent particles therein are known in numerous embodiments and are useful, for example, for concentrating and collecting solar energy [P. B. Mauer and G. T. Turechek, Research Disclosure Vol 129, paragraph 12930 (1975); German Offenlegungsschrift 26 20 115 (generally corresponding to U.S. Pat. No. 4,110,123); or A. Goetzberger and W. Greubel, Applied Physics, Vol. 14, pages 123–139 (1977)], for optical indicia transmission (G. Baur et al, U.S. Ser. No. 932,569 filed Aug. 10, 1978), for image brightening of passive displays [German Offenlegungsschrift 25 54 226 (generally corresponding to U.S. Pat. No. 4,142,781) or W. Greubel and G. Baur, Elektronik Vol. 6, pages 55–56, (1977)], or for increasing the sensitivity of scintillators [G. Keil, Nuclear Instruments and Methods, Vol. 87, pages 111–123, (1970)].

In such devices, when light strikes a fluorescent plate, the light spectrum portion which is in the excitation spectrum of the fluorescent particles within the plate is absorbed by the fluorescent centers and the remaining portion of the light spectrum permeates the fluorescent plate without disturbance. The so-absorbed radiation, shifted toward longer wavelengths and spatially undirected, is re-emitted from the fluorescent centers. By far the greatest proportion of this fluorescent light is piped in the interior of the fluorescent plate via total reflections on the plate interfaces until it emerges at specific output areas with an increased intensity.

The efficiency achieved with presently available fluorescent plate still lags significantly behind theoretically possible values, primarily because the emission spectrum overlaps the absorption spectrum so that the fluorescent radiation in the plate has a finite absorption length. This "self-absorption" is particularly unsatisfactory with fluorescent bodies having a large collecting surface.

Workers in the field are aware that many organic fluorescent materials cause a shift of the emission spectrum toward lower frequencies, relative to the excited spectrum, when such materials are dissolved in a liquid having a strongly orientating polarization effect, i.e., a so-called red shift. Such red shift occurs when a fluorescent molecule has different dipole moments, in its basic and excited state and the environment about such particle or molecule (which remains unchanged during the absorption process) can re-orientate during the existence of the excited state [see E. Lippert, Zeitschrift der Elektrochem. Ber. Bunsengesellschaft Phys. Chem., Vol. 61, pages 962–975, (1957)].

However, fluorescent bodies are preferably comprised of a solid carrier material. Such solid carriers, particularly when they are synthetic organic materials, can be readily manufactured and processed with relatively low economic outlays, which is very a significant advantage, particularly in mass production.

That a desired spectrum band separation also depends on the dielectric constant of a solvent in solid body solution and consequently the dipole differences in the basic and excited state plays an important role is suggested by the earlier cited Goetzberger and Greubel article in Applied Physics, Vol. 14, (1977), (cf. Section 3.3 therein). However, knowledge of how the suggested interrelationships might allow one to attain solid fluorescent bodies from synthetic base materials with necessary polarization properties is still absent. Above all the art still lacks knowledge of how to proceed so that a polar synthetic material can satisfy the requirements of fluorescent bodies. A fluorescent body, as is known, should be highly transparent and be thermally and photochemically stabile, should be readily formable into any desired body form, should be of sufficient hardness and form stability to provide a useful device and should have a relatively high fluorescent quantum yield.

SUMMARY OF THE INVENTION

In accordance with the principles of the invention, a device for collecting light is provided so as to comprise a body formed of a solid carrier material having an index of refraction greater than 1 and containing organic or inorganic fluorescent particles therein which exhibit finite dipole moments with different values in a basic and excited state of such particles, with the carrier material being a polar water-containing amorphous medium based on a polysilicate or a polyphosphate. In embodiments where organic fluorescent particles are utilized, an amphiphilic additive is collodially dissolved within the carrier material so as to enclose each of the fluorescent particles with a collod particle.

In certain preferred embodiments of the invention, the amphiphilic additive is a soap. In certain embodiments of the invention, the polysilicate based carrier material is a sodium or potassium silicate. In certain emobdiments of the invention, the polyphosphate based carrier material includes a mono or bivalent metal ion, such as sodium or potassium. The amphiphilic additive can be ionic, non-ionic or polymeric soaps, such as a polyethylene sorbitan monolaurate or a polyvinyl pyrrolidone or a polymethacrylic acid and salts thereof. In certain embodiments of the invention, a transparent protective coating, such as a lacquer film, is provided on the fluorescent body.

By following the principles of the invention, one attains a fluorescent body which is characterized by a noticeably lower self-absorption of light in comparison to prior art bodies of this type, and which otherwise has similar good properties.

In liquid solutions, the art is aware that amphiphilic molecules (i.e., molecules having a hydrophilic or polar end and a lipophilic or un-polar end) form characteristic ball-shaped colloids, so-called micells, in a medium which is only hydrophilic or only lipophilic. Such characteristic particles are held together via secondary valencies, cohesion forces and/or van der Waals forces and are stabile in specific temperature and concentration ranges when the system is in thermal equilibrium. One of the best known examples is aqueous soaps solutions. In such solutions, the polar ends of the soap molecules face the water molecules, whereas the un-polar ends of the soap molecules are directed toward the interior of the micell [cf. in this regard, for example, Winsor, Chemical Review, Vol. 68, pages 1–40, (1968)

or co-pending U.S. Ser. No. 062,784, (presently identified as attorney's Case No. VPA 78 P 8034, P-79,790).]

It has been discovered that amphiphic materials, when admixed with fluorescent materials, spontaneously surround or encase individual fluorescent molecules with a micell or shell structure and that such micells retain their form in the polar, water-containing, amorphous glass-like materials utilized as the carrier material in the invention. There are always a sufficient number of polar amphiphic materials so that even with the addition of such dissolved intermediaries, the fluorescent centers can encounter a sufficiently high orientation polarization with sufficiently short relaxation periods in their immediate vicinity to surpress a disruptive self-absorption of light within a fluorescent plate comprised of such carrier, amphiphilics and fluorescent particles.

BRIEF DESCRIPTION OF THE DRAWINGS

The single drawing is a somewhat schematic elevational view of an exemplary embodiment of a light-collecting device produced and operating in accordance with the principles of the invention.

DESCRIPTION OF THE PREFERRED EMBODIMENTS

The invention provides a device for collecting light.

In accordance with the principles of the invention, a device for collecting light is comprised of a body, preferably a rectangular plate-shaped body (i.e., a "fluorescent plate") functioning as a light trap and having at least one light exit window. Such a body is comprised of a solid carrier material having an index of refraction greater than 1 and having substantially uniformly dispersed therein fluorescent particles having finite dipole moments with different values in a basic or rest state and in an exited state in such particles, with such carrier material being a polar, water-containing amorphous medium, based on a polysilicate or a polyphosphate.

Such a light collecting device is illustrated in the drawing, which can be useful as a solar collector, an optical indicia transmitter or an image brightener for passive displays. Such a device includes a fluorescent plate 1 of a generally rectangular shape having a reflective layer 2 on three of its four narrow sides and is provided with a solar cell 4 on its fourth narrow side, which is a light-exit window 3. In at least certain embodiments, the plate surfaces exposed to the environment can be covered with a transparent protective film 7, for example, a lacquer film. This protective film shields the water-soluble carrier material from ambient humidity and at the same time prevents the glass-like material comprising the fluorescent body from diffusing out.

In the drawing, a typical path of a sunbeam lying in the excitation spectrum of the fluorescent particles is shown penetrating a major plane surface 7a of plate 1. As the beam penetrates into the plate 1, it is absorbed by a fluorescent center 6 and re-emitted and conducted or piped via total reflection on the interface of the plate or on the protective film 7 through the body of plate 1 to the exit window 3 onto the solar cell 4.

The carrier material utilized in the practice of the invention has an index of refraction greater than one and comprises a polar, water-containing amorphous material based on a polysilicate or a polyphosphate, i.e., a glass-like material. Such glass-like carrier material can be amorphous polysilicate or amorphous polyphosphate. Preferred polysilicates are sodiums and potassium silicates. In embodiments where a polyphosphate is utilized, a mono or bivalent metal atom is included.

The fluorescent particle utilized in the practice of the invention can be organic or inorganic compounds. Suitable organic compounds are set forth in the earlier referenced publications. An exemplary inorganic fluorescent compound is $UO_3$, which, for example can be readily dissolved in boron silicate glass.

The amphiphilic additives utilized in the practice of the invention are generally soaps and can be ionic, non-ionic or polymeric soaps. Exemplary soaps include polyethylene sorbitan monolaurate, polyvinyl pyrrolidone, polymethacrylic acid and salts thereof. Of course, conventional soaps may also be utilized. All of such soaps create a polar environment around the fluorescent particle in conjunction with the highly polar carrier medium, and in specific embodiments, the use of an amphiphilic additive renders the use of a polar solvent superfluous.

It should be noted that the amphiphilic additives function not only as an aid in dissolving or dispersing fluorescent particles in the carrier mediums but often also as a protective medium against the distribution of such particles by the partially, rather aggressive carrier medium. Thus, most organic fluorescent compounds, in water glass (i.e. sodium silicate) which has a pH of about 14, would quickly decompose without the protection afforded by a protective micell shell of an amphiphilic additive.

The fluorescent body of a light-collecting device of the invention can be produced via various methods. In a preferred embodiment, one first produces a liquid carrier material from the base materials thereof in accordance with conventional processes. A select fluorescent compound, which may be pre-mixed with an amphiphilic compound, is then admixed with the liquid carrier material. In embodiments where an amphiphilic material is utilized, an upper temperature limit, generally about 100° C., cannot be exceeded without destroying the micells. The so-attained material mixture is then case into relatively thin layers and thereafter solidified in accordance with known processes via drying.

Further details for the production of liquid polysilicates and/or polyphosphates are known in the art, for example, see Deutsches Apothekerbuch, Vol. 6 (German Pharmaceutical Book) for details concerning the manufacture of sodium silicate.

The invention is not limited to the exemplary embodiment described in detail herein. In particular, the fluorescent body can be in a form other than strictly plate-shaped as long as the light trap effect on a basis of total internal reflection is retained. Suitable body embodiments, for example, are disclosed in co-pending U.S. Ser. No. 909,553 filed May 25, 1978, which is incorporated herein by reference.

Further, as used herein the term "colloid" or "micell" is not limited to a narrow technical definition which, as is known, describes specific particle sizes. A selected micell diameter depends on a series of marginal conditions and should be noticeably smaller than a light wavelength so that no light scattering occurs at the micells.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A device for collecting light comprised of a body functioning as a light trap and having at least one light exit window, said body being comprised of a solid carrier material having an index of refraction greater than one and containing therein substantially uniformly dispersed fluorescent particles which have finite dipole moments with different values in the basic state and in the excited state of said particles, said carrier material being a polar water-containing amorphous medium based on a material selected from the group consisting of a polysilicate and a polyphosphate.

2. A device as defined in claim 1, wherein said carrier material is based on a polysilicate selected from the group consisting of sodium silicate and potassium silicate.

3. A device as defined in claim 1, wherein said carrier material is based on a polyphosphate containing a metal ion selected from the group consisting of a mono and a divalent metal.

4. A device as defined in claim 1, wherein an amphiphilic polar additive is colloidally dissolved in said carrier medium along with said fluorescent particles in such a manner that each fluorescent particle is enclosed by a colloid particle.

5. A device as defined in claim 4, wherein said fluorescent particles are organic compounds.

6. A device as defined in claim 4, wherein said amphiphilic polar additive is a soap.

7. A device as defined in claim 1, wherein said fluorescent body is provided with a transparent protective coating on surfaces thereof exposed to the environment.

8. A device as defined in claim 3, wherein said metal is sodium.

9. A device as defined in claim 3, wherein said metal is potassium.

* * * * *